(12) United States Patent
Luo et al.

(10) Patent No.: US 9,187,358 B2
(45) Date of Patent: Nov. 17, 2015

(54) PROCESS AND APPARATUS FOR FORMING SHAPED GLASS ARTICLES

(71) Applicant: CORNING INCORPORATED, Corning, NY (US)

(72) Inventors: Weiwei Luo, Painted Post, NY (US); Elias Panides, Whitestone, NY (US); Rohit Rai, Painted Post, NY (US); Irene Marjorie Slater, Lindley, NY (US); Ljerka Ukrainczyk, Painted Post, NY (US); Srinivasa Rao Vaddiraju, Painted Post, NY (US); Sam Samer Zoubi, Horseheads, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 14/269,424

(22) Filed: May 5, 2014

(65) Prior Publication Data

US 2014/0335322 A1    Nov. 13, 2014

Related U.S. Application Data

(60) Provisional application No. 61/951,585, filed on Mar. 12, 2014, provisional application No. 61/820,363, filed on May 7, 2013.

(51) Int. Cl.
*C03B 23/03* (2006.01)
*H05K 5/03* (2006.01)
*C03B 40/04* (2006.01)
*C03B 23/035* (2006.01)

(52) U.S. Cl.
CPC ......... *C03B 23/0307* (2013.01); *C03B 23/0302* (2013.01); *C03B 23/0305* (2013.01); *C03B 23/035* (2013.01); *C03B 40/04* (2013.01); *H05K 5/03* (2013.01); *Y10T 428/24653* (2015.01)

(58) Field of Classification Search
USPC ............... 65/106, 104, 105, 107; 428/130
See application file for complete search history.

(56) References Cited

U.S. PATENT DOCUMENTS

| | | | |
|---|---|---|---|
| 1,633,117 A | 6/1927 | McDanal | |
| 3,573,022 A | 3/1971 | Frank | |
| 4,047,915 A | 9/1977 | Schaffernicht et al. | 65/106 |
| 4,361,429 A | 11/1982 | Anderson et al. | |
| 4,483,700 A | 11/1984 | Forker, Jr. et al. | |
| 5,472,470 A | 12/1995 | Kormanyos et al. | |
| 5,674,790 A | 10/1997 | Araujo | 501/66 |
| 7,107,792 B2 | 9/2006 | Langsdorf et al. | 65/25.2 |
| 7,666,511 B2 | 2/2010 | Ellison et al. | 428/426 |
| 8,025,832 B2 | 9/2011 | Akilian et al. | 264/322 |
| 8,158,543 B2 | 4/2012 | Dejneka et al. | 501/68 |
| 8,586,492 B2 | 11/2013 | Barefoot et al. | 501/66 |
| 2009/0142568 A1 | 6/2009 | Dejneka et al. | 428/220 |
| 2010/0000259 A1* | 1/2010 | Ukrainczyk et al. | 65/104 |
| 2010/0129602 A1* | 5/2010 | Dejneka | 428/130 |
| 2011/0045961 A1 | 2/2011 | Dejneka et al. | 501/66 |
| 2012/0135226 A1 | 5/2012 | Bookbinder et al. | 428/335 |
| 2014/0234581 A1* | 8/2014 | Immerman et al. | 428/141 |
| 2015/0047393 A1* | 2/2015 | Luo et al. | 65/30.14 |

FOREIGN PATENT DOCUMENTS

| | | | |
|---|---|---|---|
| CN | 101186426 B | 6/2011 | C03B 11/08 |
| EP | 0338216 | 2/1989 | C03B 23/027 |
| EP | 0352033 | 7/1989 | C03B 23/03 |
| EP | 0436965 | 12/1990 | C03B 23/03 |
| GB | 940205 | 10/1963 | |
| JP | 55104931 | 1/1979 | C03B 23/023 |
| JP | 5532721 | 3/1980 | C03B 23/02 |
| JP | 5864230 | 4/1983 | C03B 23/02 |
| JP | 63008229 | 1/1988 | C03B 23/023 |
| WO | WO2007139903 A3 | 12/2007 | C03B 19/00 |
| WO | WO 2012118612 * | 9/2012 | |
| WO | WO2012142629 A1 | 10/2012 | C03B 27/44 |
| WO | WO201305589 | 1/2013 | H01L 21/683 |
| WO | WO2014073335 | 5/2014 | C03B 23/03 |

OTHER PUBLICATIONS

Patent Cooperation Treaty International Notification of Transmittal of the International Search Report and The Written Opinion of the International Searching Authority, international application No. PCT/US2014/036512: mailing date May 2, 2014, 13 pages.

* cited by examiner

*Primary Examiner* — Mark Halpern
(74) *Attorney, Agent, or Firm* — John T. Haran

(57) ABSTRACT

A process using a three-piece mold for making a three-dimensionally shaped glass article having a flat area and a curved/bend area is disclosed. The process includes placing a glass sheet on a mold having a shaping surface with a desired surface profile for the shaped glass article including a flat area and a bend area, moving a flat area plunger toward the glass sheet to compress the glass sheet, heating a portion of the glass sheet corresponding to an area above the bend area of the mold to a temperature above a forming temperature, and moving a bend area plunger toward the heated glass sheet to compress the heated glass sheet. A temperature of the glass sheet in the area above the bend area of the mold is higher than a temperature of the glass sheet in the area above the flat area of the mold when compressing the heated glass sheet with the bend area plunger.

11 Claims, 15 Drawing Sheets

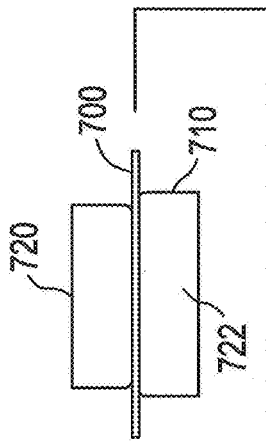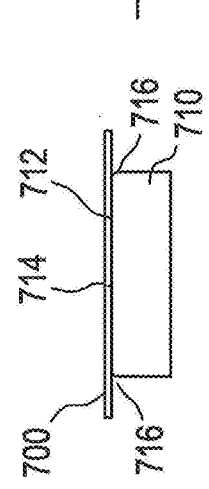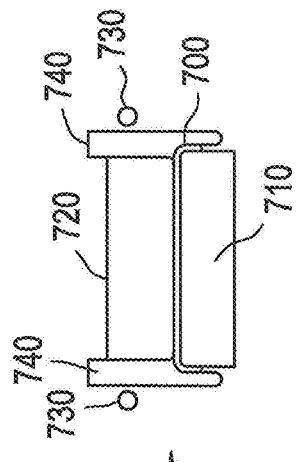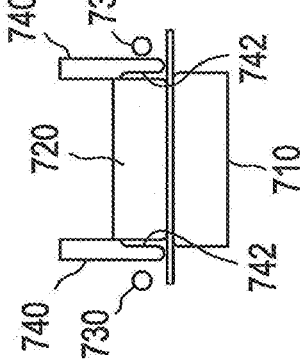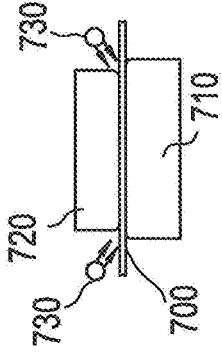

PROCESS AND APPARATUS FOR FORMING SHAPED GLASS ARTICLES

CROSS-REFERENCE TO RELATED APPLICATIONS

This application claims the benefit of priority under 35 U.S.C. §119 of U.S. Provisional Application Ser. No. 61/820,363 filed on May 7, 2013 and U.S. Provisional Application Ser. No. 61/951,585 filed on Mar. 12, 2014, the content of each is relied upon and incorporated herein by reference in its entirety.

BACKGROUND

1. Field

The present disclosure relates to forming shaped glass articles, for example covers for mobile or handheld electronic devices.

2. Background

Covers for handheld devices are required to be aesthetically pleasing while being functional. There is also a growing trend to have three-dimensionally shaped covers, wherein a portion of the cover is flat and another portion is shaped, for example having a bend or curve. Glass is one of the materials that can be used to make such covers; however processes and apparatuses are needed to form shaped glass articles having a flat region and a bend region. The present disclosure relates to processes and apparatuses for forming shaped glass articles with attributes that make them useful as cover glasses.

SUMMARY

A first aspect includes making a three-dimensionally shaped glass article, including placing a glass sheet in a forming tool, wherein the forming tool includes a mold having a shaping surface with a desired surface profile for the shaped glass article including a flat area and a bend area, a flat area plunger having a shaping surface corresponding to the flat area of the mold, and a bend area plunger having a shaping surface corresponding to the bend area of the mold. The process also includes moving the flat area plunger toward the glass sheet to compress the glass sheet, heating a portion of the glass sheet corresponding to an area above the bend area of the mold to a temperature above a forming temperature, and moving the bend area plunger toward the heated glass sheet to compress the heated glass sheet, thereby forming a shaped glass article having a flat area and a bend area. A temperature of the portion of the glass sheet in the area above the bend area of the mold is higher than a temperature of a portion of the glass sheet in an area above the flat area of the mold when compressing the heated glass sheet with the bend area plunger.

In some embodiments, the mold, the flat area plunger, and the bend area plunger are porous. In some embodiments, a gas flows through the porous mold, flat area plunger, and bend area plunger to form a compressive gas layer above and below the glass sheet. In some embodiments, the bend area plunger provides the heat for heating the portion of the glass sheet corresponding to the area above the bend area of the mold. In some embodiments, a radiant heater provides the heat for heating the portion of the glass sheet corresponding to the area above the bend area of the mold.

In some embodiments, the bend area of the mold includes a first bend area and a second bend area. In some embodiments, the bend area plunger is a first bend area plunger arranged above the first bend area of the mold and wherein the forming tool also includes a second bend area plunger arranged above the second bend area of the mold. In some embodiments, the flat area of the mold includes a first flat area and a second flat area. In some embodiments, the flat area plunger is a first flat area plunger arranged above the first flat area of the mold and the forming tool also includes a second flat area plunger arranged above the second flat area of the mold.

In some embodiments, a portion of the glass sheet compressed between the flat area plunger and the mold is held at a viscosity in a range from $10^{12}$ P to $10^{13.7}$ P. In some embodiments, a portion of the glass sheet between the flat area plunger and the mold is compressed in a range from 10 kPa to 1 MPa. In some embodiments, a portion of the glass sheet compressed between the bend area plunger and the mold is held at a viscosity in a range from $10^{9.6}$ P to $10^{11}$ P. In some embodiments, a portion of the glass sheet between the bend area plunger and the mold is compressed in a range from 10 kPa to 1 MPa.

A second aspect includes an apparatus for making a three dimensionally shaped glass article having a mold having a shaping surface with a desired surface profile for the shaped glass article including a flat area and a bend area, a flat area plunger positioned over the flat area of the mold and having a shaping surface corresponding to the flat area of the mold, a bend area plunger positioned over the bend area of the mold and having a shaping surface corresponding to the bend area of the mold, and a heater positioned to heat a region of a glass sheet placed over the bend area of the mold, wherein the flat area plunger and the bend area plunger move relative to one another.

In some embodiments, the mold, the flat area plunger, and the bend area plunger are porous. In some embodiments, a gas source is connected to the porous mold, flat area plunger, and the bend area plunger so that gas can flow through the porous mold, flat area plunger, and bend area plunger to form a compressive gas layer above and below the glass sheet. In some embodiments, the heater is incorporated in the bend area plunger. In some embodiments, the heater is a radiant heater positioned adjacent the bend area plunger.

In some embodiments, the bend area of the mold includes a first bend area and a second bend area. In some embodiments, the bend area plunger is a first bend area plunger arranged above the first bend area of the mold and wherein the apparatus also includes a second bend area plunger arranged above the second bend area of the mold. In some embodiments, the flat area of the mold includes a first flat area and a second flat area. In some embodiments, the flat area plunger is a first flat area plunger arranged above the first flat area of the mold and the apparatus also includes a second flat area plunger arranged above the second flat area of the mold.

A third aspect includes a 3D glass structure formed by the process described above.

It is to be understood that both the foregoing general description and the following detailed description are exemplary and are intended to provide an overview or framework for understanding the disclosure. The accompanying drawings are included to provide a further understanding and are incorporated in and constitute a part of this specification.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

FIGS. 7A-7E show an exemplary schematic of a bend press process using a three-piece mold.

DETAILED DESCRIPTION

Figure 1A:
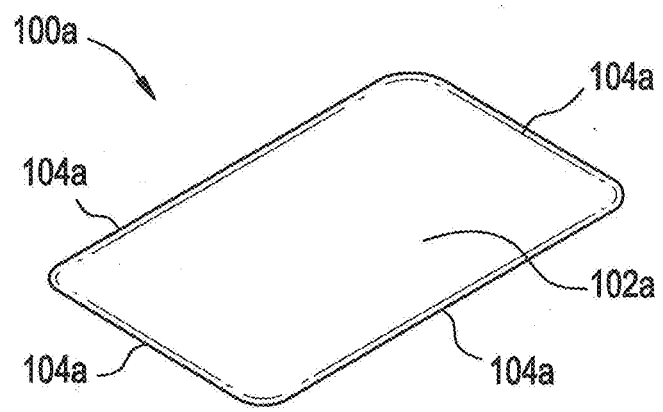
FIGS. 1A-1B show examples of a dish shaped glass cover and a sled shaped glass cover, respectively.

In the following detailed description, numerous specific details may be set forth in order to provide a thorough understanding of embodiments described herein. However, it will be clear to one skilled in the art when embodiments may be practiced without some or all of these specific details. In addition, like or identical reference numerals may be used to identify common or similar elements.

Disclosed are materials, compounds, compositions, and components that can be used for, can be used in conjunction with, can be used in preparation for, or are embodiments of the disclosed method and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

The term "or", as used herein, is inclusive; more specifically, the phrase "A or B" means "A, B, or both A and B". Exclusive "or" is designated herein by terms such as "either A or B" and "one of A or B", for example.

The indefinite articles "a" and "an" are employed to describe elements and components of embodiments. The use of these articles means that one or at least one of these elements or components is present. Although these articles are conventionally employed to signify that the modified noun is a singular noun, as used herein the articles "a" and "an" also include the plural, unless otherwise stated in specific instances. Similarly, the definite article "the", as used herein, also signifies that the modified noun may be singular or plural, again unless otherwise stated in specific instances.

It is noted that terms like "preferably," "commonly," and "typically," when utilized herein, are not utilized to limit the scope or to imply that certain features are critical, essential, or even important to the structure or function of the disclosure. Rather, these terms are merely intended to identify particular aspects of an embodiment or to emphasize alternative or additional features that may or may not be utilized in a particular embodiment of the present disclosure.

It is noted that one or more of the claims may utilize the term "wherein" as a transitional phrase. For the purposes of the disclosure, it is noted that this term is introduced in the claims as an open-ended transitional phrase that is used to introduce a recitation of a series of characteristics of the structure and should be interpreted in like manner as the more commonly used open-ended preamble term "comprising."

Figure 1B:
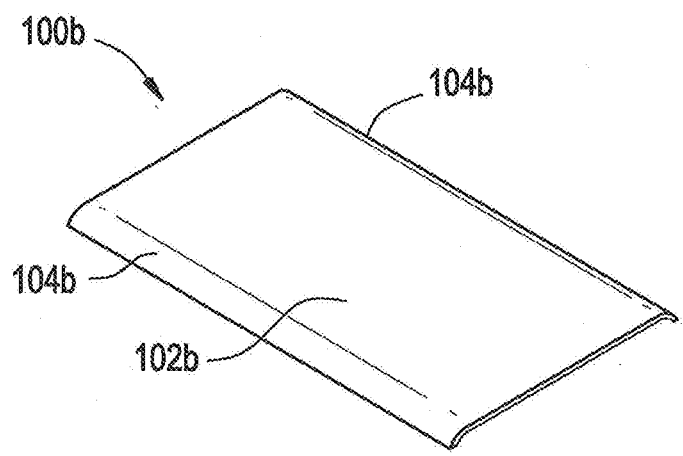

GORILLA® GLASS is used as cover glass in consumer electronics because of its outstanding mechanical properties. The high strength and damage resistance of GORILLA® GLASS are of interest for consumer electronics, especially handhelds and touch screen applications because of scratch and damage resistance when the device is dropped or otherwise mechanically impacted in daily use. In most applications, cover glass is two-dimensional (i.e., flat). But there has been a large customer pull for three-dimensionally shaped glass for both front and back phone covers driven by industrial design. For example, touch screens and displays integrated with glass shapes having a large flat area and curved sections that wrap around device edges have been of most interest. FIG. 1A illustrates an exemplary shaped cover glass 100a having a dish shape such that a top surface has a flat (or nearly flat) region 102a in the middle bounded by four bent/curved sides 104a. FIG. 1B illustrates another exemplary shaped cover glass 100b having a sled shape such that a top surface has a flat (or nearly flat) region 102b in the middle bounded by four sides, wherein two of the sides 104b, which oppose each other, are bent/curved.

Figure 2A:
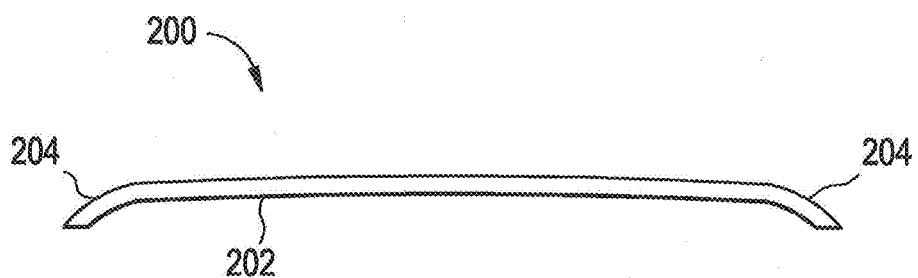
FIGS. 2A-2B show an exemplary cross-sectional view of a shaped glass article having a spline radius typical for consumer electronics applications, where the glass bend radius decreases towards the edge.
Figure 2B:
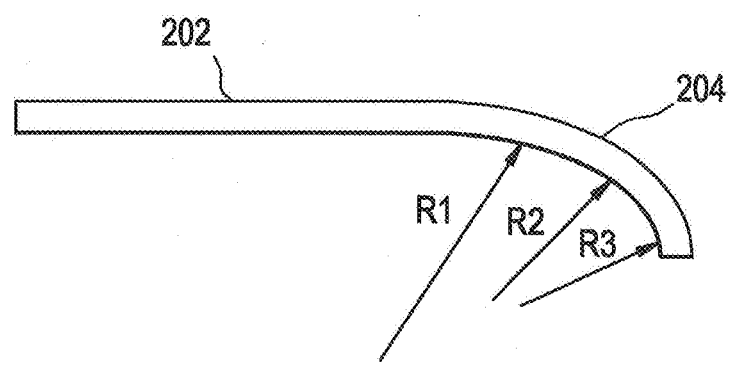

FIG. 2A is an exemplary cross sectional view of a shaped glass article 200 made according to the processes described herein having a front or back cover glass section 202 that can be substantially flat and a side cover glass section 204. Flat regions 102a, 102b of shaped cover glass 100a, 100b can serve as front or back cover glass section 202 and curved/bent sides 104a, 104b of shaped cover glass 100a, 100b can serve as a side cover glass section 204. Small bend radii (0.5-5 mm)

for side cover glass section 204 are desirable to maximize the display area of the cover glass, while still achieving a wrap-around shape. Bend radii that decrease towards the edge can also be desirable to achieve a seamless transition between glass and bezel. As shown for example in FIG. 2B, bend radii R1, R2, and R3 decrease along a transition from flat front or back cover glass section 202 to the curved/bent side cover glass section 204, wherein R1 is closest to front or back cover glass section 202, R3 is closest to an edge 206 of curved/bent side cover glass section 204, and R2 is in between R1 and R3. In some embodiments, R3 can be in a range from about 0.5 mm to about 5 mm.

Figure 3A:
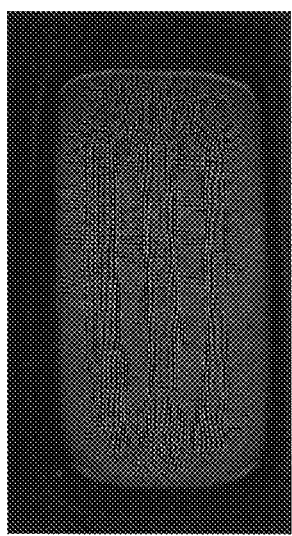
FIGS. 3A-3C show exemplary three 3D shaped glass sheets over a grid, formed by two mold pressing, vacuum sagging, and machining, respectively. The grid reflection shows how the glass surface distorts the transmission of light due to inherent process issues in making the 3D parts via two-mold pressing, one-mold vacuum sagging, and machining.
Figure 3B:
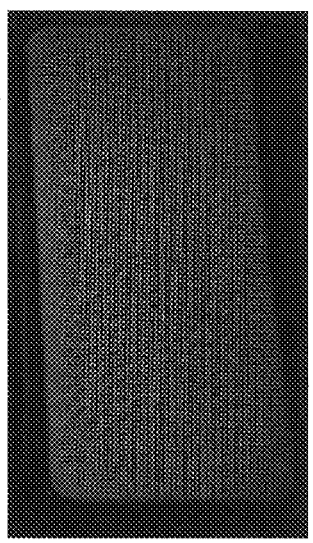
Figure 3C:
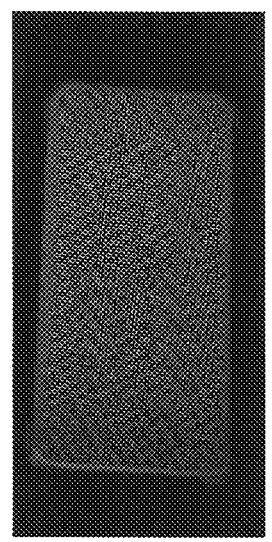

The shapes described above with respect to FIGS. 1A-2B are quite challenging to form in glass by either thermal forming or glass machining. Thermal forming can include heating a flat two-dimensional glass sheet and (1) pressing the glass between two complementary shaped molds ("two mold pressing") or (2) pulling a vacuum to cause the glass to conform to the shape of a mold ("vacuum sagging"). A common defect from two mold pressing or vacuum sagging is optical distortion in the glass which can be observed in the reflection of a grid as shown in FIG. 3A for two mold pressing and in FIG. 3B for vacuum sagging. Also, as shown in FIG. 3C, glass machining can result in optical distortions. It is not possible to fully remove all machining marks near the corners and tight bends when polishing a concave side of such a glass shape, and it is quite challenging to achieve even polish over curved sections without optical distortions.

Figure 4A:
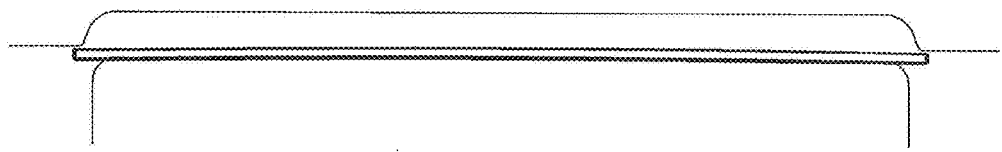
FIGS. 4A-4D show the optical distortion caused by buckling of the glass sheet (FIGS. 4A-4B) and stretching of the flat region into a corner (FIGS. 4C-4D) in a conventional two-mold pressing process.
Figure 4B:
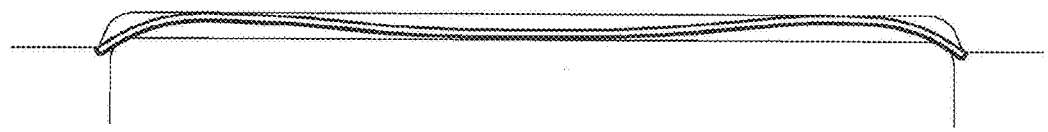
Figure 4C:
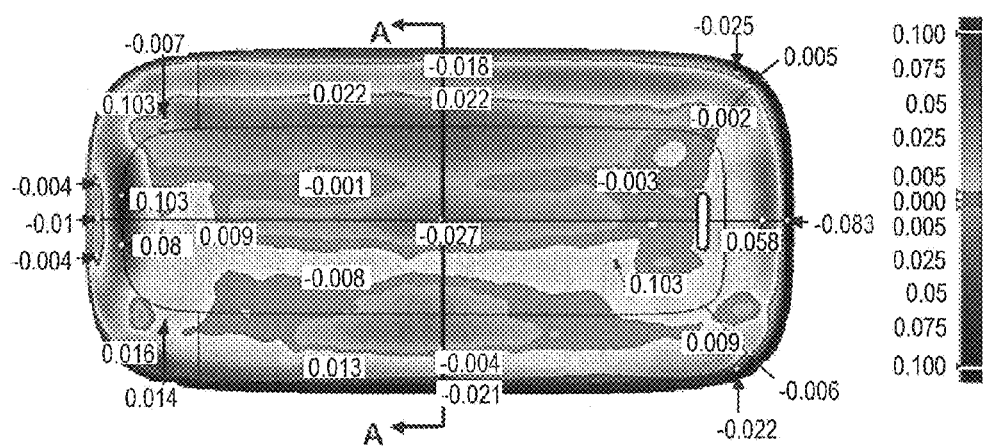
Figure 4D:
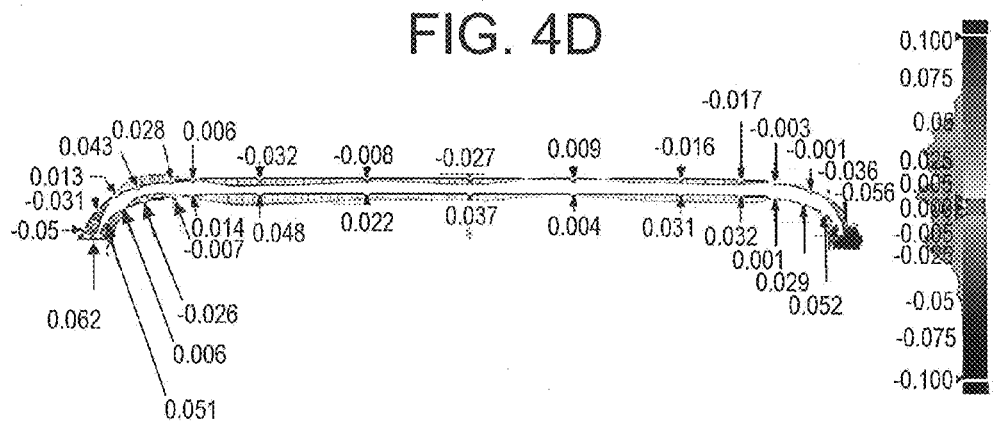
Figure 5:
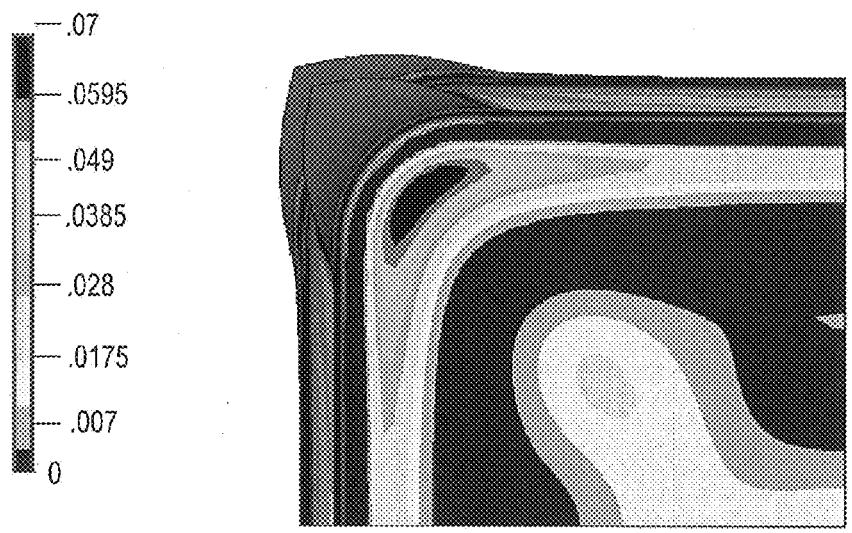
FIG. 5 shows deviation of the glass sheet in a corner region from a desired shape in a conventional two-mold pressing process.

The optical distortion from two mold pressing can be caused by buckling in the forming process as shown for example in FIGS. 4A-4D. FIG. 4A illustrates a glass sheet positioned in a two mold press before heat and pressure application. FIG. 4B illustrates the buckling that occurs to the section of the glass that is intended to be flat during the heating and pressing. FIG. 4C illustrates a simulation measuring the buckling effect in the flat region in plan view and measures the deviation in millimeters of a glass sheet from a desired shape. FIG. 4D illustrates the measuring of the buckling effect in a cross sectional view along line A-A in FIG. 4C from a desired shape in millimeters. Also, thinning can occur in the corners during two mold pressing because the glass is stretched to form the shape of the corners. This is illustrated for example in FIG. 5, which illustrates a simulation measuring a deviation in millimeters of a shaped glass article from a desired shape in the corner region.

Figure 6A:
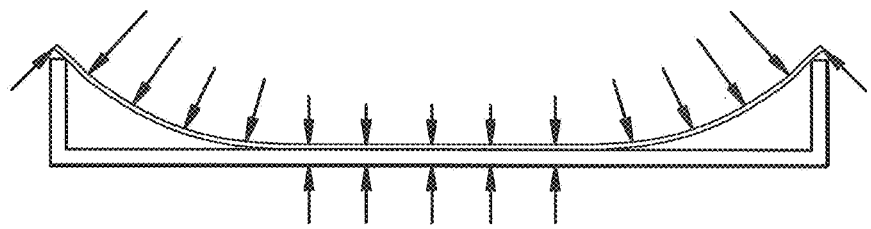
FIGS. 6A-6D shows the distortion mechanism caused by buckling of the glass sheet in a one-mold process using vacuum only, or vacuum and pressure forming.
Figure 6B:
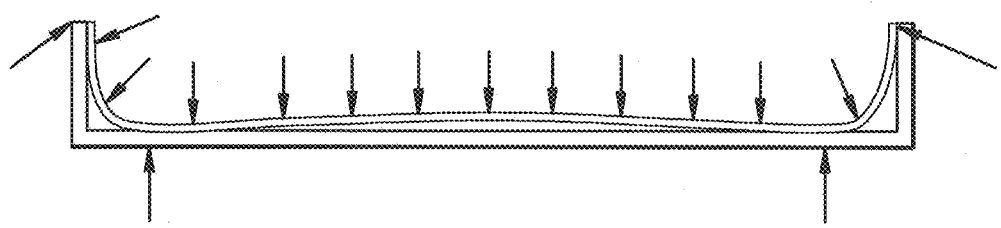
Figure 6C:
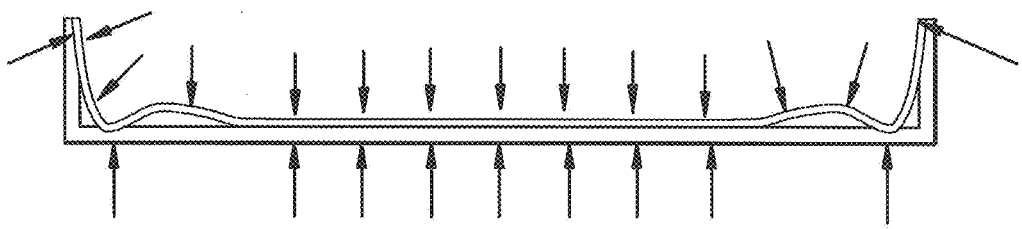
Figure 6D:
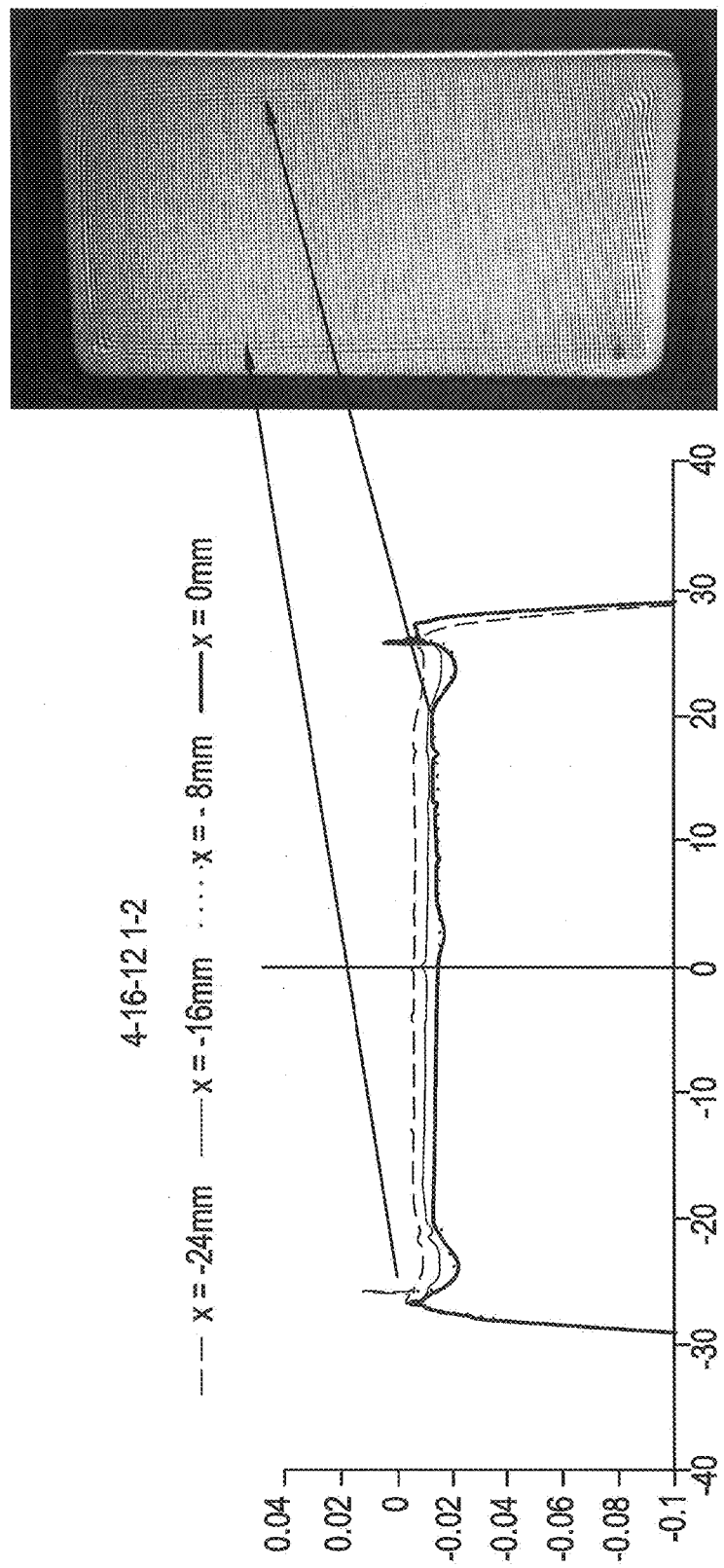

The optical distortion from vacuum sagging can also be caused by buckling in the forming process as shown for example in FIGS. 6A-6C, which illustrate the shape of the glass at different points during the process. As can be seen in FIG. 6C, buckling occurs by the curved/bent regions. This is also shown in FIG. 6D, which measures a deviation of a shaped glass article from a desired shape at various points along a width of the shaped glass article taken at four locations along the length of the shaped glass article. The y axis measures the deviation in millimeters and the x axis measures the distance along the width of the shaped glass article from the center (zero on the x axis). The arrows point to the areas of the shaped glass article corresponding to the greatest deviation.

The processes and apparatuses described herein address the cosmetic and distortion issues in the flat area when forming a three-dimensionally shaped glass article, and enable precision forming tight bend radii and complex splines. For example, the use of a forming tool having a three-piece mold for shaping the glass can overcome, or minimize, the problems discussed above. A three-piece mold can include a bottom mold having a shaping surface corresponding to a desired surface profile of a shaped glass article including a flat area and a bend area; a flat area plunger having a shaping surface corresponding to the flat area of the mold and positioned above and aligned with the flat area of the mold; and a bend area plunger having a shaping surface corresponding to the bend area of the mold and positioned above and aligned with the bend area of the mold. The three-piece mold configuration allows for heating different portions of the glass to different temperatures during the shaping process and/or applying different pressures to different portions of the glass. Thus, the three-piece mold allows for a varying temperature and/or pressure profile across the width of the glass. For example, the portion of the glass shaped by the bend area plunger can be heated to a higher temperature by heating the bend area plunger and have more pressure applied to it than the portion of the glass under the flat area plunger by applying more compressive force with the bend area plunger than the flat area plunger.

Figure 8:
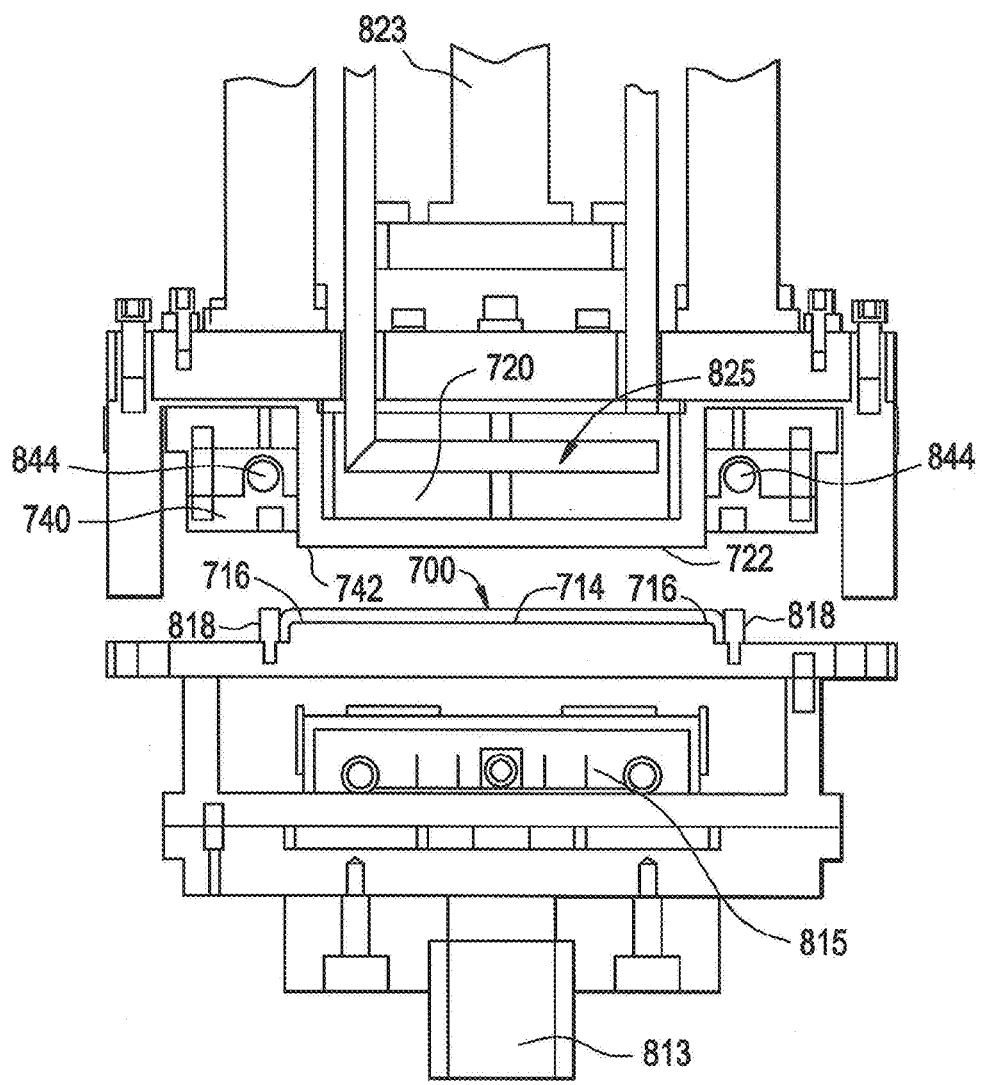
FIG. 8 is an exemplary cross-sectional view of a three-piece mold.

FIGS. 7A-7E and FIG. 8 illustrate an exemplary embodiment of the present disclosure for forming a three-dimensional ("3D") shaped glass article having a flat region and a curved/bend region. FIGS. 7A-7E illustrate an exemplary step by step view of the process using a three-piece mold. FIG. 8 is a cross-sectional view showing more detail of the exemplary three-piece mold shown in FIGS. 7A-7E. A 3D cover glass can be made by thermally reforming the shaped glass from a two-dimensional ("2D") flat glass sheet. In some embodiments, the 2D glass sheet can be extracted from a pristine sheet of glass formed by a fusion process. The pristine nature of the glass can be preserved up until the glass is subjected to a strengthening process, such as an ion-exchange chemical strengthening process.

First, a 2D glass sheet 700 can be placed on a mold 710 in a forming tool. Mold 710 can have a shaping surface 712 with a desired surface profile of a shaped glass article including a flat area 714 and a bend area 716. (FIG. 7A) In some embodiments, mold 710 can include alignment pins 818 for accurately positioning the glass sheet on mold 710. In some embodiments, glass sheet 700 can be preheated before being placed in the forming tool. For example, glass sheet 700 can be preheated using an air-bearing preheat station wherein, for example, glass sheet 700 can be heated to about 600° C. for a cycle time of less than about 60 seconds. In other embodiments, mold 710 can be placed in a furnace and glass sheet 700 can be convection heated. This allows mold 710 to be at or close to the forming temperature and minimizes the time glass sheet 700 is on mold 710, thus lowering the manufacturing cost. In some embodiments, the furnace enclosure can be an inert or vacuum atmosphere, or an ambient atmosphere. Use of a vacuum or inert atmosphere can provide increased cleanliness.

Next, mold 710 can be indexed into a press station where a region of the glass sheet corresponding to the flat region of the finished shaped glass article is placed under compression. (FIG. 7B) This can be accomplished using a flat area plunger 720 having a shaping surface 722 corresponding to flat area 714 of mold 710. Mold 710 and/or flat area plunger 720 move to compress glass sheet 700. In some embodiments, a servo driven actuator 813, 823 moves mold 710 and/or flat area plunger 720 with a precisely controlled speed, for example, in a range from about 0.01 mm/sec to about 10 mm/sec. In some embodiments either flat area plunger or mold 710 are stationary while compressing the region of glass sheet 700 corresponding to the flat region of the finished shaped glass article. In some embodiments, the region of glass sheet 700 corresponding to the flat region of the finished shaped glass article can be compressed at a pressure from about 10 kPa to about 1

MPa. In some embodiments, the heat and pressure applied to the region of glass sheet 700 corresponding to the flat region of the finished shaped glass article hold the flat region at a viscosity in a range from about $10^{12}$ P to about $10^{13.7}$ P.

Next, the region of glass sheet 710 corresponding to the bend region of the finished shaped glass article can be heated to above a forming temperature of glass sheet 710, which is a temperature at which glass sheet 710 can be formed to a desired shape. (FIG. 7C) In some embodiments, radiant heaters 730 can provide the heat to obtain the forming temperature. In some embodiments, the bend region can be heated for about 10 seconds or less to reach the forming temperature.

Next, a bend area plunger 740 having a shaping surface 742 corresponding to bend area 716 of mold 710 is lowered toward glass sheet 710. (FIG. 7D) Bend area plunger 740 can surround an outer perimeter of flat area plunger 730 and moves independently from flat area plunger 730. In some embodiments, bend press plunger 740 can provide the heat for heating the bend region to the forming temperature in addition to or instead of radiant heaters 730. In such instances, bend press plunger 740 can include a heater 844. In some embodiments, the region of glass sheet 700 corresponding to the bend region can be heated to the forming temperature while the region of glass sheet 700 corresponding to the flat region is not heated to the forming temperature. This is one advantage of a three-piece mold over two-piece molds and vacuum sagging because it allows for varying a temperature and/or pressure profile across the width glass sheet 700. Since glass sheet 710 can be flat when placed on mold 710, the region of glass sheet 700 corresponding to the flat region is kept below the forming temperature of glass sheet 700. This can be accomplished by not directly heating the region of glass sheet 700 corresponding to the flat region. Also, to counteract the effect of heat from the bend region dissipating to the flat region, flat region 714 of mold 710 can include and/or flat area plunger 730 can include a cooling chamber 815, 825 respectively. In some embodiments, bend area plunger 740 can be driven by upper servo actuator with a precisely controlled speed, for example, in a range of from about 0.01 mm/sec to about 10 mm/sec. In some embodiments, the region of glass sheet 700 corresponding to the bend region of the finished shaped glass article can be compressed at a pressure from about 10 kPa to about 1 MPa. In some embodiments, the heat and pressure applied to the region of glass sheet 700 corresponding to the bend region of the finished shaped glass article hold the bend region at a viscosity that is sufficiently low to prevent high stress when the bend region is formed, but still high enough to prevent cosmetic defects and mold marks to transfer to glass sheet 700, for example, in a range from about $10^{9.6}$ P to about $10^{11}$ P.

The bend regions in the shaped glass article can be formed by moving bend area plunger 740 downward with a precisely controlled speed until a desired force or position is achieved. In some embodiments, heat is no longer supplied and the bends are held under compression to relieve stress and prevent snap back, while they cool. (FIG. 7E) The process illustrated in FIGS. 7A-7E is merely exemplary and the process can include additional steps.

Figure 9:
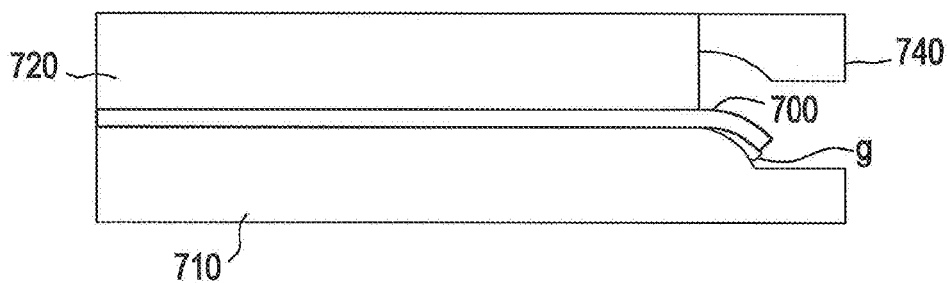
FIG. 9 pictorially describes the gap between the glass and bottom mold to (1) avoid overpressing marks on the bend area of the glass, (2) prevent cosmetic damage on a concave side of the bend where defects are more difficult to polish, and (3) compensate for initially faster contraction of the glass after pressing relative to the mold.

In some embodiments, to prevent glass scuffing and mold marks on the concave side of the bends, shaping surface 712 of mold 710 can be undersized by about 100 μm to about 200 μm in bend area 716, as shown for example in FIG. 9, so that there is a gap g between the bend region of glass 700 and bend area 716. Shaping surface 712 also needs to be undersized to compensate for the differential thermal expansion of glass and the mold material. In the visco-elastic regime, glass expansion rapidly increases and exceeds that of the mold material. As the glass cools, the thermal expansion of glass is less or close to that of common mold materials that can be used for pressing, such as coated nickel superalloys (Inconel, Hastalloy, etc.), graphite, silicon carbide or tungsten carbide.

In some embodiments, the mold, flat area plunger, and bend area plunger can be porous and connected to a pressurized gas source. This permits the formation of a compression gas layer between the glass sheet and the mold, flat area plunger, and bend area plunger such that the glass sheet does not contact the mold, flat area plunger and bend area plunger. This can be advantageous because contact between the glass sheet and the mold, flat area plunger, and bend area plunger can cause cosmetic defects on the shaped glass article. Also typical materials for mold pieces, such as nickel alloy, need to be refinished or recoated after every few hundred cycles as a result of contact with the hot glass. The presence of the compression gas layers between the glass sheet and the mold, flat area plunger, and bend area plunger can minimize or eliminate these problems because the glass sheet does not contact the mold pieces, and thereby extends the mold life.

FIGS. 10A-10E illustrate an exemplary process for forming a three-dimensional ("3D") shaped glass article having a flat region and a curved/bend region that is analogous to the process shown in FIGS. 7A-7E except that, as described below, mold 710', flat area plunger 720', and bend area plunger 740' are porous. Mold 710', flat area plunger 720', and bend area plunger 740' can be connected to a pressurized chemically inert gas source, such as, but not limited to, nitrogen or argon. The gas can flow from the gas source through mold 710', flat area plunger 720', and bend area plunger 740' to shaping surfaces 712', 722' and 742', respectively. In some embodiments, each of mold 710', flat area plunger 720' and bend area plunger 740' can be made from a porous material, such as, but not limited to, metal, graphite, or mullite. In such embodiments, mold 710', flat area plunger 720', and bend area plunger 740' can be manufactured so that along the perimeter of each, there is only pores on shaping surfaces 712', 722', and 742' and surfaces connected to the pressurized gas source. In other embodiments, mold 710', flat area plunger 720' and bend area plunger 740' can be made of a nonporous material, such as, but not limited to, stainless steel or nickel, and a matrix of holes can be drilled into mold 710' flat area plunger 720' and bend area plunger 740' to provide pores between the pressurized gas source and shaping surfaces 712', 722', and 742'. In some embodiments, the pores can be sized to avoid imprinting marks on the glass surface. In some embodiments, mold 710', flat area plunger 720' and bend area plunger 740' can be made of an anisotropic material.

Figure 10A:
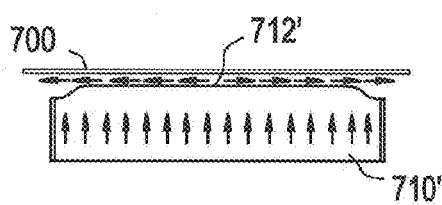
FIGS. 10A-10E is an exemplary schematic of a bend press process using a porous three-piece mold.
Figure 10B:
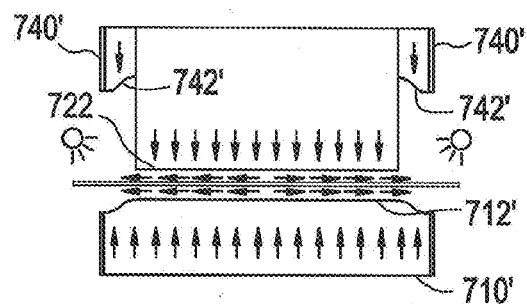
Figure 10C:
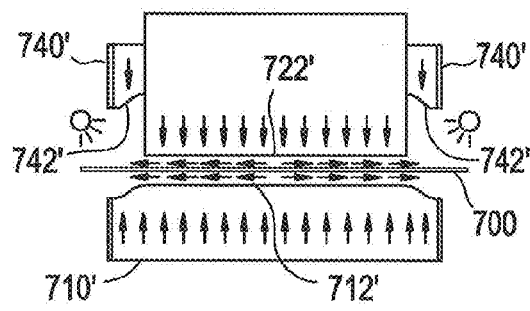
Figure 10D:
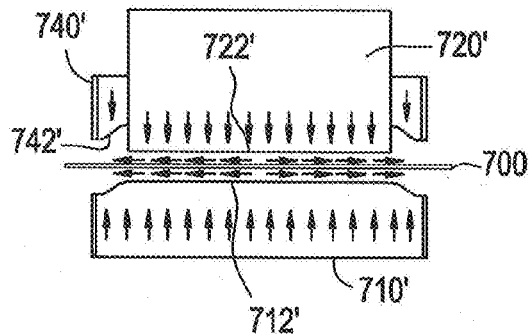
Figure 10E:
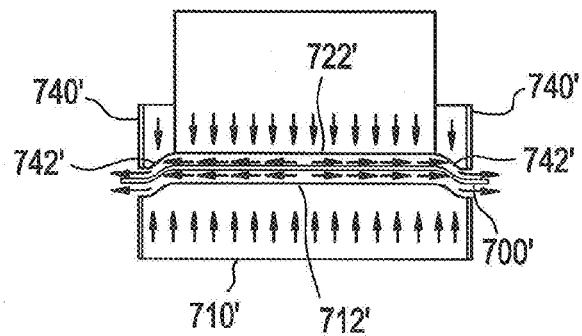

The flow of the gas through mold 710' can be at a sufficient flow rate and/or pressure to form a layer of gas between shaping surface 712' and a glass sheet that acts as a bed of gas capable of holding the glass sheet, as shown for example in FIG. 10A. The flow of the gas through flat area plunger 720' can be at a sufficient flow rate and/or pressure to form a layer of gas between shaping surfaces 722' and the glass sheet to provide a compressive force sufficient to maintain the flatness of the glass sheet, as shown for example in FIG. 10B. Similarly, the flow of the gas through bend area plunger 740' can be at a sufficient flow rate and/or pressure to form a layer of gas between shaping surface 742' and the glass sheet to provide a compressive force sufficient to create a bend region in the glass sheet, as shown for example in FIG. 10E.

The thickness of the gas layers can vary depending on the local air bearing response, but in some embodiments can be on an order of about 1 micron, about 10 microns, about 100 microns, or more. The thickness of each gas layer can be the same or different. For example, the thickness of the gas layer between flat area plunger 720' and mold 710' can be different than the thickness of the gas layer between bend area plunger 740' and mold 710'. The compressive force or load exerted by each gas layer can vary along a length of the gas layer. In some embodiments, the gas can be heated. In some embodiments, as discussed above, a benefit of the "three-piece" mold is that it allows for varying the pressure profile across the width of the glass. As such, in some embodiments, the compressive force or load of each gas layer and the thickness can be different; and in other embodiments they can be the same.

In some embodiments, a cross-sectional view of the three piece mold assembly shown in FIGS. 10A-10E can be the same as that shown in FIG. 8 except that mold 710', flat area plunger 720' and bend area 740' have pores and there is tubing to deliver the gas from a gas source. In some embodiments, a compressor is connected to the gas source upstream of the mold. In some embodiments, the gas can be supplied at a constant pressure through a pressure regulating device. In other embodiments, the gas can be supplied at constant flow using an active controller that adjusts the pressure to provide constant gas flow.

While FIGS. 10A-10E, illustrate each of mold 710', flat area plunger 720', and bend area plunger 740' being porous, this is merely exemplary. Any combination of porous and nonporous mold pieces can be used.

FIGS. 7A-7E, 8, and 10A-10E, illustrate a three-piece mold, however, in some embodiments, depending upon the desired shape of the glass article, the forming tool can include a four-piece mold, a five-piece mold, a six-piece mold, or more. In some embodiments, the forming tool would have more than three mold pieces if the edge of the shaped glass article has more than two bends/curves. In such an instance, there could be a first bend area plunger for the first bend region positioned above and aligned with a corresponding first bend region on the mold's shaping surface and a second bend area plunger for the second bend region positioned above and aligned with a corresponding second bend region on the mold's shaping surface. In other embodiments, if the desired shape of the glass article has multiple non-contiguous flat areas with bend area in between, then the forming tool can include a flat area plunger for each flat area and a bend area plunger for each bend area.

Further process techniques and methods that may be applicable to the processes described herein include those described in U.S. Patent Application Publication No. 2010/0000259 (Ukrainczyk, "Method of Making Shaped Glass Articles"), European Patent Application No. 10306317.8, which published as European Patent Application EP2457881 (Corning Incorporated, "Method and Apparatus for Bending a Sheet of Material into a Shaped Article"), U.S. patent application Ser. No. 13/480,172, which published as U.S. Patent Application Publication No. 2012/0297828 (Bailey et al., "Glass Molding System and Related Apparatus and Method"), U.S. Provisional Application No. 61/545,332 to which U.S. patent application Ser. No. 13/647,043 claims the benefit, which published as U.S. Patent Application Publication No. 2013/0086948 (Bisson et al., "Apparatus and Method for Tight Bending Thin Glass Sheets"), and U.S. Provisional Application No. 61/545,329, to which PCT Application No. PCT/US12/58950 claims the benefit, which published as WIPO Publication No. WO 2013/05589 (Bisson et al., "Reshaping Thin Glass Sheets") all incorporated by reference. The 2D glass sheet can be made by any known process, including rolling, fusion, float, etc.

As discussed above, in some embodiments, the front cover glass section of the 3D cover glass (e.g., 202) is flat. In some embodiments, the flat front cover glass has a flatness of better than ±10 µm, ±25 µm, ±50 µm, ±75±100 µm, ±125 µm, ±150 µm, ±100 µm, ±200 µm, ±250 µm, ±300 µm, or ±400 µm over a 25 mm×25 mm area, as measured by a FlatMaster® tool. In one embodiment, the flat front cover glass section has a flatness of better than ±100 µm over a 25 mm×25 mm area, as measured by a FlatMaster® tool. In other embodiments, the front cover glass section can be curved.

In some embodiments, each side cover glass section of the 3D cover glass (e.g., 204) includes a bend. The bend angle and radius can be selected based on the peripheral side geometry of the electronic device. In one embodiment, the bend angle is in a range from greater than 0 to 90°. In some embodiments, the bend radius is greater than 1 mm. In some embodiments, the bend radius is about 0.25, 0.5, 0.75, 1.0, 1.25, 1.5, 1.75, 2.0, 2.25, 2.5, 2.75, 3.0, 3.5, 4.0, 4.5, 5.0, 6.0, 7.0, 8.0, 9.0, 10.0, 15.0, 20.0 mm or more. In some embodiments, the bend is a complex bend that has a changing radius, such as described by a Burmester curve. In an alternate embodiment, the bend angle can be greater than 90°.

In some embodiments, the 3D cover glass has a uniform wall thickness typically in a range from 0.3 mm to 3 mm. In some embodiments, the thickness is about 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0. In one embodiment, the total variation in the wall thickness of the cover glass wall is within ±100 µm. In another embodiment, the total variation in the wall thickness of the cover glass wall is within ±10 µm, ±20 µm, ±30 µm, ±40 µm, ±50±60 µm, ±70 µm, ±80 µm, ±90 µm, ±100 µm, ±125 µm, ±150 µm, ±200 µm, or ±250 µm.

The 3D cover glass has an inside surface and an outside surface. When the 3D cover glass is placed on an electronic device, the inside surface would be on the inside of the assembly, whereas the outside surface would be on the outside of the assembly. Each surface is smooth, and this smoothness can be characterized by surface roughness. In one embodiment, the average surface roughness (Ra) of each surface of the 3D cover glass is less than 1 nm. In another embodiment, the average surface roughness (Ra) of each surface of the 3D cover glass is less than 0.7 nm. In some embodiments, the average surface roughness (Ra) of each surface of the 3D cover glass is less than 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0 nm. In another embodiment, the average surface roughness (Ra) of at least one of the surfaces of the 3D cover glass is less than 0.3 nm. In some embodiments, the average surface roughness (Ra) of at least one of the surfaces of the 3D cover glass is less than 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0 nm.

The surface roughnesses of the inside and outside surfaces can be the same or different. The latter can be the case, for example, if the 3D cover glass is made by a mold and only one of the surfaces comes into contact with the mold during forming of the 3D cover glass. Typically, the surface of the 3D cover glass contacting the mold will be the outside surface. However, it is possible to design the mold such that the surface of the 3D cover glass not contacting the mold will be the outside surface.

In some embodiments, the surfaces of the 3D cover glass are essentially flawless. By "essentially flawless," it is meant that there are no indentations (or dimples) larger than 150 µm in diameter, as measured by an optical microscopy technique, in the surfaces. In some embodiments, there are less than an average of 50, 40, 30, 20, 10, 5, 4, 3, 2, or 1 indentations (or dimples) larger than 150 μm in diameter in an 25 mm×25 mm area on any of the surfaces, as measured by optical microscopy.

In some embodiments, the 3D glass is transparent and has an optical transmission greater than 85% in a wavelength range of 400 nm to 800 nm. In some embodiments, the 3D cover glass is transparent and has an optical transmission greater than 75%, 80%, 85%, 87%, 90%, 93%, 95%, 97%, or 99% in a wavelength range of 400 nm to 800 nm.

A coating can be deposited on a surface of the 3D cover glass to make a portion of the 3D cover glass semi-transparent or opaque. The portion of the 3D cover glass in which the coating is not deposited can be a clear aperture on the front cover glass section, which would allow for viewing of and interaction with an electronic device display.

In some embodiments, the 3D cover glass is resistant to damage in terms of compressive stress. In some embodiments, the compressive stress at surface of the glass is greater than 300 MPa. In one embodiment, the cover glass has a compressive stress greater than 250, 300, 350, 400, 450, 500, 550, 600, 650, 700, 750, 800, 850, 900, 950, 1000 MPa or more. The 3D cover glass (or the 2D glass sheet used in making the 3D cover glass) can be subjected to a strengthening process to achieve the compressive stress that is greater than 300 MPa. In some embodiments, the 3D cover glass is subjected to an ion-exchange chemical strengthening process to achieve a combination of a compressive stress greater than 300 MPa and an ion-exchange depth of layer of at least 25 μm. In some embodiments, the ion-exchange depth of layer is at least 10, 15, 20, 25, 30, 35, 40, 45, or 50 μm. The ion-exchange depth of layer is measured from a surface of the glass into the glass. An ion-exchanged layer is characterized by the presence of oversized ions in the glass lattice structure.

In some embodiments, the 3D cover glass is resistant to damage characterized in terms of hardness and/or scratch resistance. In one embodiment, the 3D cover glass has a hardness greater than 7 on the Mohs scale. In some embodiments, the 3D cover glass has a hardness of about 6, 6.3, 6.5, 6.7, 7.0, 7.3, 7.5, 7.7, 8, 8.3, 8.5, 8.7, or 9 on the Mohs scale.

As a result of the raw materials and/or equipment used to produce the glass compositions described herein, certain impurities or components that are not intentionally added can be present in the final glass composition. Such materials are present in the glass composition in minor amounts and are referred to herein as "tramp materials."

As used herein, a glass composition having 0 mol % of a compound is defined as meaning that the compound, molecule, or element was not purposefully added to the composition, but the composition may still comprise the compound, typically in tramp or trace amounts. Similarly, "iron-free," "alkali earth metal-free," "heavy metal-free" or the like are defined to mean that the compound, molecule, or element was not purposefully added to the composition, but the composition may still comprise iron, alkali earth metals, or heavy metals, etc., but in approximately tramp or trace amounts.

In some embodiments, the 3D cover glass is made from an alkali aluminosilicate glass composition. An exemplary alkali aluminosilicate glass composition comprises from about 60 mol % to about 70 mol % $SiO_2$; from about 6 mol % to about 14 mol % $Al_2O_3$; from 0 mol % to about 15 mol % $B_2O_3$; from 0 mol % to about 15 mol % $Li_2O$; from 0 mol % to about 20 mol % $Na_2O$; from 0 mol % to about 10 mol % $K_2O$; from 0 mol % to about 8 mol % MgO; from 0 mol % to about 10 mol % CaO; from 0 mol % to about 5 mol % $ZrO_2$; from 0 mol % to about 1 mol % $SnO_2$; from 0 mol % to about 1 mol % $CeO_2$; less than about 50 ppm $As_2O_3$; and less than about 50 ppm $Sb_2O_3$; wherein 12 mol %≤$Li_2O$+$Na_2O$+$K_2O$≤20 mol % and 0 mol %≤MgO+CaO≤10 mol %. This alkali aluminosilicate glass is described in U.S. Pat. No. 8,158,543 (Sinue Gomez et al., "Fining Agents for Silicate Glasses").

Another exemplary alkali-aluminosilicate glass composition comprises at least about 50 mol % $SiO_2$ and at least about 11 mol % $Na_2O$, and the compressive stress is at least about 900 MPa. In some embodiments, the glass further comprises $Al_2O_3$ and at least one of $B_2O_3$, $K_2O$, MgO and ZnO, wherein −340+27.1 $Al_2O_3$−28.7$B_2O_3$+15.6$Na_2O$−61.4$K_2O$+8.1−(MgO+ZnO)≥0 mol %. In particular embodiments, the glass comprises: from about 7 mol % to about 26 mol % $Al_2O_3$; from 0 mol % to about 9 mol % $B_2O_3$; from about 11 mol % to about 25 mol % $Na_2O$; from 0 mol % to about 2.5 mol % $K_2O$; from 0 mol % to about 8.5 mol % MgO; and from 0 mol % to about 1.5 mol % CaO. The glass is described in U.S. Provisional Patent Application No. 61/503,734, filed Jul. 1, 2011, to which U.S. patent application Ser. No. 13/533,298 claims the benefit, which published as U.S. Patent Application Publication No. 2013/0004758 (Matthew J. Dejneka et al., "Ion Exchangeable Glass with High Compressive Stress"), the contents of which are incorporated herein by reference in their entirety.

Other types of glass compositions besides those mentioned above and besides alkali-aluminosilicate glass composition can be used for the 3D cover glass. For example, alkali-aluminoborosilicate glass compositions can be used for the 3D cover glass. In some embodiments, the glass compositions used are ion-exchangeable glass compositions, which are generally glass compositions containing small alkali or alkaline-earth metals ions that can be exchanged for large alkali or alkaline-earth metal ions. Additional examples of ion-exchangeable glass compositions can be found in U.S. Pat. No. 7,666,511 (Ellison et al; 20 Nov. 2008), U.S. Pat. No. 4,483,700 (Forker, Jr et al.; 20 Nov. 1984), and U.S. Pat. No. 5,674,790 (Araujo; 7 Oct. 1997) and U.S. patent application Ser. No. 12/277,573 (Dejneka et al.; 25 Nov. 2008), which published as U.S. Patent Application Publication No. 2009/0142568, Ser. No. 12/392,577 (Gomez et al.; 25 Feb. 2009), which issued as U.S. Pat. No. 8,158,543, Ser. No. 12/856,840 (Dejneka et al.; 10 Aug. 2010), which published as U.S. Patent Application Publication No. 2011/0045961, Ser. No. 12/858,490 (Barefoot et al.; 18 Aug. 18, 2010), which issued as U.S. Pat. No. 8,586,492, and Ser. No. 13/305,271 (Bookbinder et al.; 28 Nov. 2010), which published as U.S. Patent Application Publication No. 2012/0135226.

A three dimensionally shaped glass article, such as a 3D cover glass, made according to the process described herein can be used to cover an electronic device having a flat display. The 3D cover glass will protect the display while allowing viewing of and interaction with the display. The 3D cover glass has a front cover glass section for covering the front side of the electronic device, where the display is located, and one or more side cover glass sections for wrapping around the peripheral side of the electronic device. The front cover glass section is contiguous with the side cover glass section(s).

EXAMPLES

Various embodiments will be further clarified by the following examples.

Comparative Example 1

Figure 11:
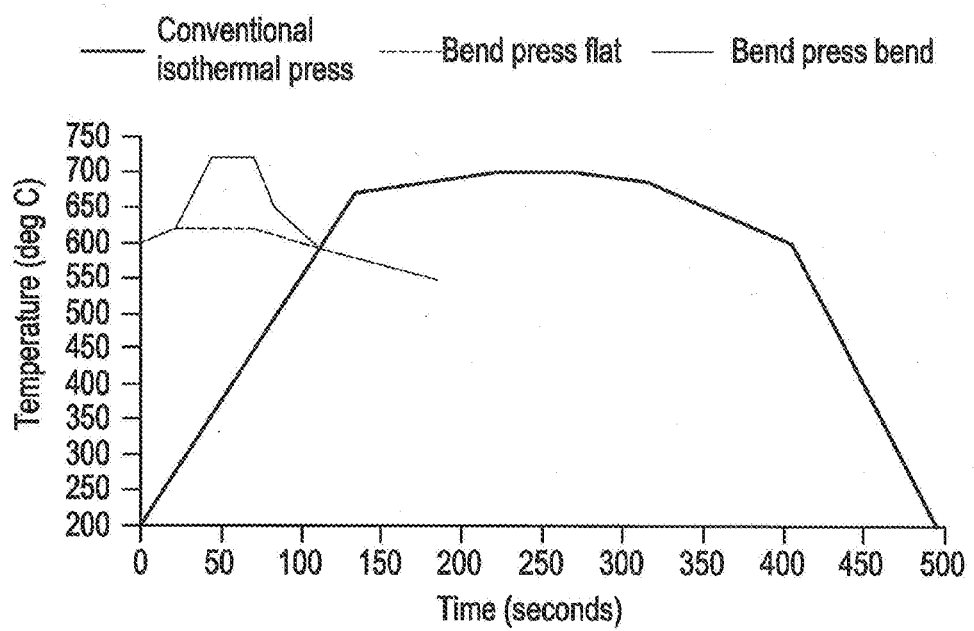
FIG. 11 is a graph showing a thermal cycle comparison between a conventional isothermal press and a three-piece mold bend press.
Figure 12A:
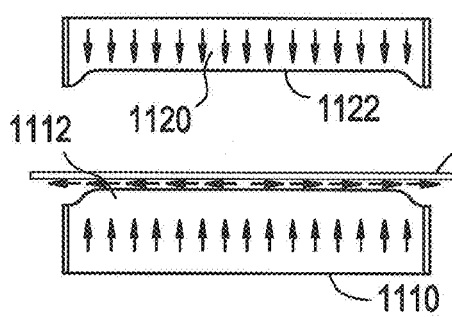
FIG. 12A-12D is an exemplary schematic of a bend press process using a porous two-piece mold.
Figure 12B:
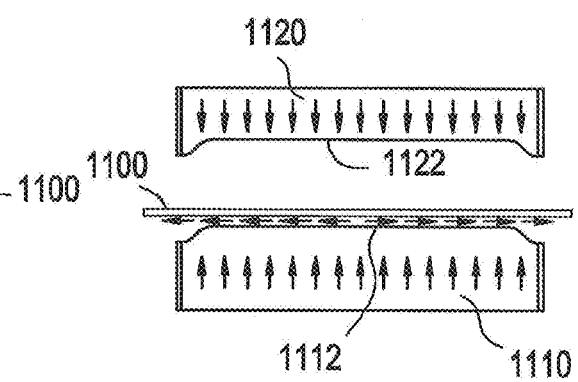
Figure 12C:
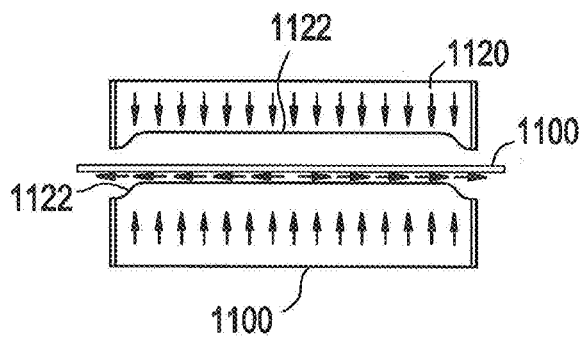
Figure 12D:
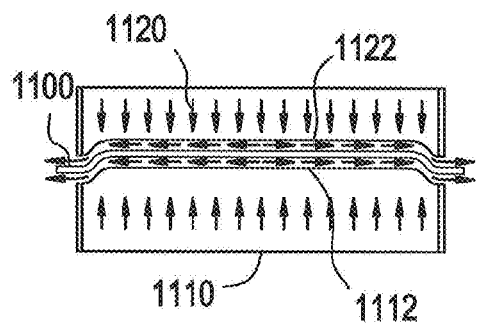

A glass sheet having Corning glass composition no. 2317 was shaped into a three-dimensional shaped glass article using (1) a pressing process with a three piece mold wherein the glass sheet under the flat area plunger and the bend area plunger are heated to different temperatures and (2) a conventional isothermal pressing process using a two piece mold wherein the glass sheet is heated uniformly across its entire length. FIG. 11 compares the thermal cycle of the two processes. The three piece mold has a considerably shorter thermal cycle because the bottom mold has a much smaller temperature excursion than in the isothermal process. In the three piece mold process the mold cycles between 550-570° C. and 620° C., with exception of the mold in the bend area. In the conventional isothermal press process mold cycles from 550-570° C. to 700° C., which is much larger, and therefore increases both the heat up and cooling time. This illustrates the benefit of using a three-piece mold, which allows the temperature profile to vary across the width of the glass sheet, over a two-piece mold.

Comparative Example 2

Figure 13:
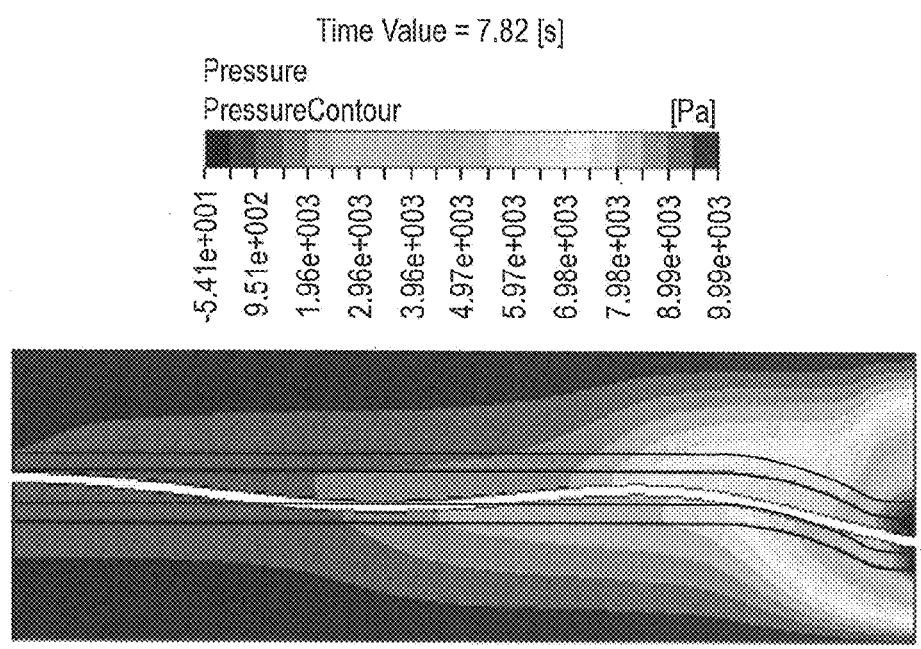
FIG. 13 is a graph showing a pressure profile across the width of the glass using a two-piece mold bend pressing process.
Figure 14:
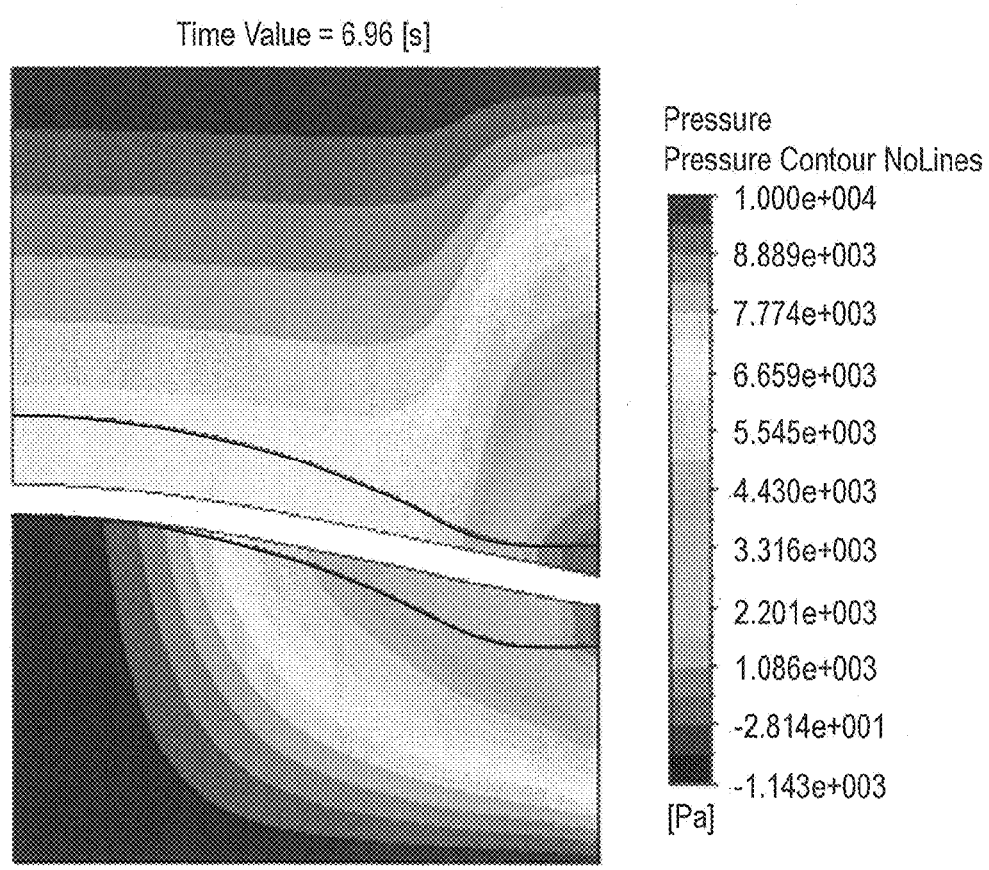
FIG. 14 is a graph showing a pressure profile across the width of the glass using a three-piece mold bend pressing process.

A simulation was run for shaping a glass sheet into a three-dimensional shaped glass article using (1) a pressing process with a three-piece porous mold, as shown for example in FIGS. 10A-10E and (2) a pressing process with a two-piece porous mold, as shown for example in FIGS. 12A-12D. As can be seen in FIGS. 12A-12D a glass sheet 1100 is compressed between a porous bottom mold 1110 having a shaping surface 1112 with a flat area 1114 and a bend area 1116 and a porous top mold 1120 having a shaping surface 1122 with a flat area 1124 and a bend area 1126. Shaping surfaces 1112 and 1122 are complementary in shape. FIG. 13 illustrates the pressure profile across the length of a 700 µm thick glass heated to 770° C. for the two piece mold and FIG. 14 illustrates the pressure profile across the width of a 700 µm thick glass heated to 770° C. for the three piece mold. As can be seen by comparing FIGS. 13 and 14, in the process using the two-piece mold the glass sheet buckles in the flat area, whereas in the process using the three-piece mold does not buckle. This again illustrates the benefit of using a three-piece mold, which allows the temperature profile to vary across the width of the glass sheet, over a two-piece mold because being able to control the temperature profile prevents buckling of the glass in the flat region.

While the process, apparatuses, and compositions herein have been described with respect to a limited number of embodiments, those skilled in the art, having benefit of this disclosure, will appreciate that other embodiments can be devised which do not depart from the scope of the disclosure. Accordingly, the scope should only be limited by the attached claims.

The invention claimed is:

1. A process for making a three-dimensionally shaped glass article, comprising:
    (a) placing a glass sheet in a forming tool, the forming tool comprising:
        a mold having a shaping surface with a desired surface profile for the shaped glass article including a flat area and a bend area;
        a flat area plunger having a shaping surface corresponding to the flat area of the mold; and
        a bend area plunger having a shaping surface corresponding to the bend area of the mold;
    (b) compressing the glass sheet between the flat area plunger and the flat area of the mold;
    (c) heating a portion of the glass sheet corresponding to an area above the bend area of the mold to a temperature above a forming temperature; and
    (d) moving the bend area plunger toward the heated glass sheet to compress the heated glass sheet between the bend area plunger and the bend area of the mold, thereby forming a shaped glass article having a flat area and a bend area,
    wherein a temperature of the portion of the glass sheet in the area above the bend area of the mold is higher than a temperature of a portion of the glass sheet in an area above the flat area of the mold when compressing the heated glass sheet with the bend area plunger, and
    wherein (b) occurs before (d).

2. The process of claim 1, wherein the mold, the flat area plunger, and the bend area plunger are porous.

3. The process of claim 2, further comprising flowing a gas through the porous mold, flat area plunger, and bend area plunger to form a compressive gas layer above and below the glass sheet.

4. The process of claim 1, wherein (c) comprises heating the portion of the glass sheet corresponding to the area above the bend area of the mold with the bend area plunger.

5. The process of claim 1, wherein (c) comprises heating the portion of the glass sheet corresponding to the area above the bend area of the mold with a radiant heater.

6. The process of claim 1, wherein the bend area of the mold comprises a first bend area and a second bend area, wherein the bend area plunger is a first bend area plunger arranged above the first bend area of the mold, and wherein the forming tool further comprises a second bend area plunger arranged above the second bend area of the mold.

7. The process of claim 1, wherein the flat area of the mold comprises a first flat area and a second flat area, wherein the flat area plunger is a first flat area plunger arranged above the first flat area of the mold, and wherein the forming tool further comprises a second flat area plunger arranged above the second flat area of the mold.

8. The process of claim 1 further comprising holding a viscosity of a portion of the glass sheet compressed between the flat area plunger and the mold in a range from $10^{12}$ P to $10^{13.7}$ P.

9. The process of claim 1, wherein (b) comprises compressing a portion of the glass sheet between the flat area plunger and the mold in a range from 10 kPa to 1 MPa.

10. The process of claim 1 further comprising holding a viscosity of a portion of the glass sheet compressed between the bend area plunger and the mold in a range from $10^{9.6}$ P to $10^{11}$ P.

11. The process of claim 1, wherein (d) comprises compressing a portion of the glass sheet between the bend area plunger and the mold in a range from 10 kPa to 1 MPa.

* * * * *